US008732509B2

(12) United States Patent
Kwak (10) Patent No.: US 8,732,509 B2
(45) Date of Patent: *May 20, 2014

(54) TIMING SYNCHRONIZATION CIRCUIT WITH LOOP COUNTER

(75) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 766 days.

This patent is subject to a terminal disclaimer.

(21) Appl. No.: 12/755,664

(22) Filed: Apr. 7, 2010

(65) Prior Publication Data

US 2010/0199117 A1 Aug. 5, 2010

Related U.S. Application Data

(63) Continuation of application No. 11/612,798, filed on Dec. 19, 2006, now Pat. No. 7,716,510.

(51) Int. Cl.
| G06F 1/12 | (2006.01) |
| G06F 1/04 | (2006.01) |
| G06F 1/10 | (2006.01) |
| G11C 7/22 | (2006.01) |
| H03L 7/081 | (2006.01) |
| G06F 11/16 | (2006.01) |

(52) U.S. Cl.
CPC .. *G06F 1/04* (2013.01); *G06F 1/10* (2013.01); *G06F 1/12* (2013.01); *G06F 11/1679* (2013.01); *G11C 7/22* (2013.01); *G11C 7/222* (2013.01); *H03L 7/0812* (2013.01)
USPC ............................ 713/401; 713/400; 713/503

(58) Field of Classification Search
CPC ............... G06F 1/04; G06F 1/10; G06F 1/12; G06F 11/1679; G11C 7/22; G11C 7/222; H03L 7/0812
USPC .......................................... 713/400, 401, 503
See application file for complete search history.

(56) References Cited

U.S. PATENT DOCUMENTS

| 6,424,592 | B1 | 7/2002 | Maruyama | |
| 6,636,110 | B1 | 10/2003 | Ooishi et al. | 327/565 |
| 6,687,185 | B1 | 2/2004 | Keeth et al. | 365/233 |
| 6,781,861 | B2 | 8/2004 | Gomm et al. | |
| 6,914,798 | B2 | 7/2005 | Kwon et al. | |
| 6,930,955 | B2 | 8/2005 | Johnson et al. | 365/233 |
| 7,046,060 | B1 | 5/2006 | Minzoni et al. | |
| 7,065,001 | B2 | 6/2006 | Johnson et al. | 365/233 |
| 7,119,591 | B1 | 10/2006 | Lin | 327/158 |
| 7,336,752 | B2 | 2/2008 | Vlasenko et al. | |
| 7,489,172 | B2 | 2/2009 | Kim | |
| 7,656,745 | B2 | 2/2010 | Kwak | 365/233.1 |
| 7,716,510 | B2 * | 5/2010 | Kwak | 713/400 |

(Continued)

Primary Examiner — M Elamin
(74) Attorney, Agent, or Firm — Dorsey & Whitney LLP (57) ABSTRACT

An apparatus for synchronizing an output clock signal with an input clock signal includes a first timing synchronization circuit, control logic, and a counter. The first timing synchronization circuit is operable to generate a delay to synchronize a reference clock signal representative of the input clock signal with a feedback clock signal representative of the output clock signal responsive a strobe signal. The control logic is operable to generate an enable signal based on the reference clock signal and generate the strobe signal based on the feedback clock signal. The counter is operable to count cycles of the reference clock signal occurring between the enable signal and the strobe signal to generate a loop count for the first timing synchronization circuit.

24 Claims, 4 Drawing Sheets

(56) References Cited

U.S. PATENT DOCUMENTS

| | | | |
|---|---|---|---|
| 8,018,791 B2 | 9/2011 | Kwak | 365/233.1 |
| 2002/0057624 A1 | 5/2002 | Manning | 365/233 |
| 2005/0270852 A1 | 12/2005 | Dietrich et al. | |
| 2006/0062341 A1 | 3/2006 | Edmondson et al. | |
| 2006/0182212 A1* | 8/2006 | Hwang et al. | 375/354 |
| 2008/0144423 A1 | 6/2008 | Kwak | 365/233.1 |
| 2008/0232179 A1 | 9/2008 | Kwak | 365/194 |
| 2010/0103754 A1 | 4/2010 | Kwak | 365/194 |
| 2011/0298512 A1 | 12/2011 | Kwak | 327/161 |

* cited by examiner

TIMING SYNCHRONIZATION CIRCUIT WITH LOOP COUNTER

CROSS-REFERENCE TO RELATED APPLICATION

This application is a continuation of U.S. patent application Ser. No. 11/612,798, filed Dec. 19, 2006, and issued as U.S. Pat. No. 7,716,510. This application and patent are incorporated by reference herein, in their entirety, for any purpose.

BACKGROUND OF THE INVENTION

The present invention relates generally to the field of timing synchronization and, more particularly, to a timing synchronization circuit with loop counter.

Many high speed electronic systems operate with critical timing requirements that dictate a need to generate a periodic clock waveform possessing a precise timing relationship with respect to some reference signal. The improved performance of computing integrated circuits and the growing trend to include several computing devices on the same board present a challenge with respect to synchronizing the time frames of all the components.

While the operation of all components in the system should be highly synchronized, i.e., the maximum skew in time between significant edges of the internally generated clocks of all the components should be minimized, it is not enough to feed the external clock of the system to all the components. This is because different chips may have different manufacturing parameters, which, when taken together with additional factors such as ambient temperature, voltage, and processing variations, may lead to large differences in the phases of the respective chip generated clocks.

Synchronization can be achieved by using a timing circuit, such as a digital delay locked loop (DDLL) circuit, to detect the phase difference between clock signals of the same frequency and produce a digital signal related to the phase difference. DDLL circuits may require a relatively large number of clock cycles to synchronize. As a result of this significant lock period, DDLL circuits are not typically disabled after a lock is achieved to conserve power. DDLL circuits are also not well suited to handle large temperature or voltage shifts due to their slow response time. In conjunction with a DLL circuit, an open-loop topology may be used, such as a measure-controlled delay (MCD) circuit, where a timing measurement directly controls a variable delay. MCD circuits exhibit a fast lock capability (e.g., within 1-4 clock cycles after initialization). The MCD circuit generates an initial measurement, and the DDLL takes over to maintain the lock and track variations over time.

BRIEF DESCRIPTION OF THE SEVERAL VIEWS OF THE DRAWINGS

The invention will hereafter be described with reference to the accompanying drawings, wherein like reference numerals denote like elements, and.

DETAILED DESCRIPTION OF THE INVENTION

One or more specific embodiments of the present invention are described below. It is specifically intended that the present invention not be limited to the embodiments and illustrations contained herein, but include modified forms of those embodiments including portions of the embodiments and combinations of elements of different embodiments as come within the scope of the following claims.

Embodiments of the present invention will now be described with reference to the attached figures. Various structures, systems and devices are schematically depicted in the drawings for purposes of explanation only and so as to not obscure the embodiments of the present invention with details that are well known to those skilled in the art. Nevertheless, the attached drawings are included to describe and explain illustrative examples of embodiments of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. Nothing in this application is considered critical or essential to the present invention unless explicitly indicated as being "critical" or "essential."

Figure 1:
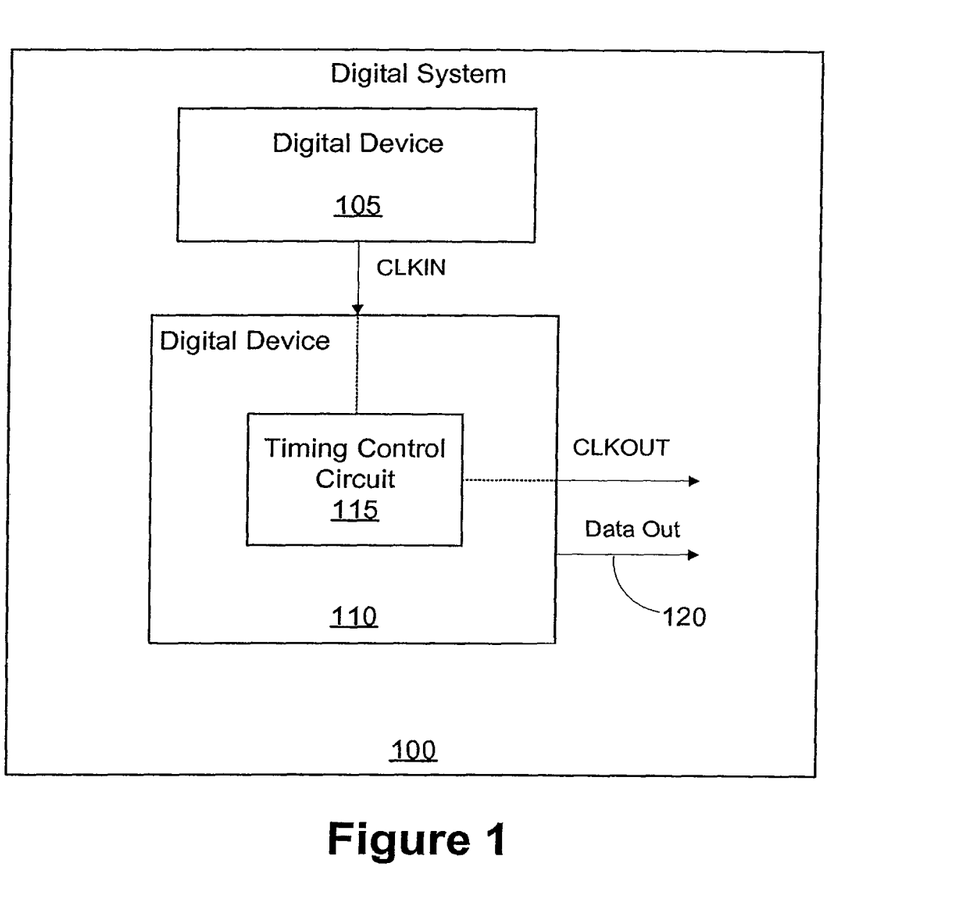
FIG. 1 is a simplified block diagram of a digital system having a timing control circuit in accordance with the present invention.

Referring now to the drawings wherein like reference numbers correspond to similar components throughout the several views and, specifically, referring to FIG. 1, the present invention shall be described in the context of a digital system 100. The digital system 100 includes a first digital device 105 coupled to a second digital device 110. The first digital device 105 provides a reference clock signal (CLKIN) to the second digital device 110. The second digital device 110 uses the CLKIN signal to synchronize its internal clocks using a timing control circuit 115 to generate an output clock signal (CLKOUT). As an illustrative example, the first digital device 105 may be a microprocessor and the second digital device 110 may be a memory device that synchronizes its output data on a data line 120 with the CLKOUT signal.

Figure 2:
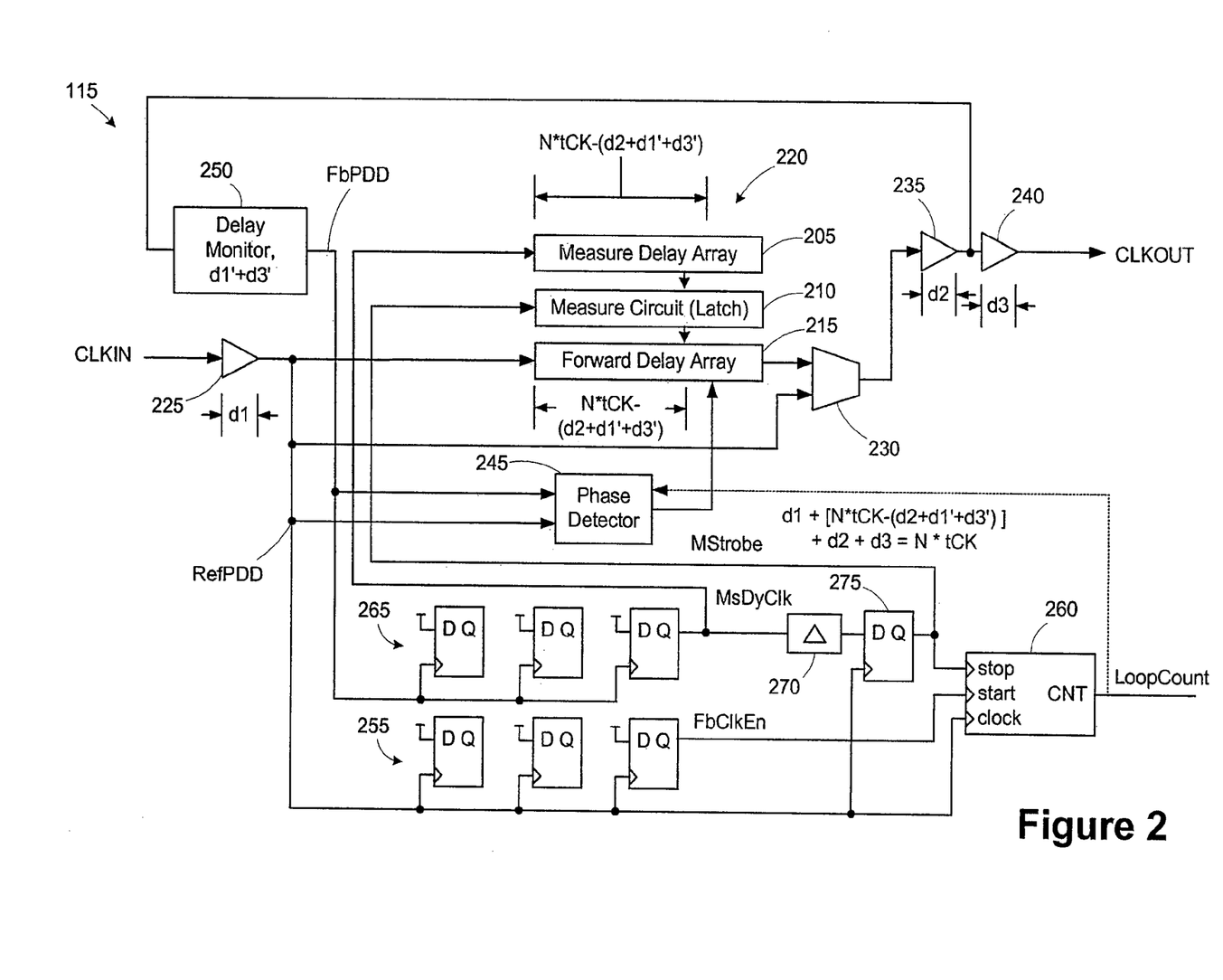
FIG. 2 is a simplified block diagram of the timing control circuit of FIG. 1.

Turning now to FIG. 2, a simplified block diagram of the timing control circuit 115 in accordance with one illustrative embodiment of the present invention is illustrated. The timing control circuit 115 includes a measure delay array 205, a measure circuit 210, and a forward delay array 215 that combine to form an MCD circuit 220. An external clock signal (CLKIN) is provided to a buffer circuit 225, which is in turn coupled to the forward delay array 215. The buffer circuit 225 represents the input circuitry of the second digital device 110 (see FIG. 1). It may include one or more buffers and/or other logic circuitry.

A multiplexer 230 is coupled to receive inputs from the buffer 225 and the forward delay array 215. The multiplexer 230 is controlled during a measurement initialization cycle to bypass the forward delay array 215 until the timing signals have propagated through the timing control circuit 115 and the MCD circuit 220 can be locked, as will be described in greater detail below. Following the measurement initialization cycle, the multiplexer 230 is controlled to select the output of the forward delay array 215 as its input.

Although embodiments of the present invention are described with reference to an MCD circuit to establish the initial synchronization between the input and output clock signals, the scope of these embodiments is not so limited. Other types of synchronization circuits, including a synchronous mirror delay circuit and a phase locked loop circuit may be used.

The output of the multiplexer 230 is provided to a buffer circuit 235, and the buffer circuit 235 is in turn coupled to another buffer circuit 240. The buffer circuit 240 represents the output circuitry (i.e., output drivers, slew rate control devices, etc.) of the second digital device 110 (see FIG. 1). It may include one or more buffers and/or other logic circuitry. The output of the buffer circuit 240 represents the output clock signal (CLKOUT) used by the digital device 110.

A phase detector 245 is coupled to the buffer 225 for receiving a reference clock signal (RefPDD) and to a delay monitor 250 for receiving a feedback clock signal (FbPDD). The phase detector 245 measures a phase difference between the RefPDD signal provided by the buffer circuit 225 and the FbPDD signal exiting the delay monitor 250. The phase detector 245 controls the amount of delay imposed by the forward delay array 215 responsive to the measured phase difference.

The delay monitor 250 models the delay introduced into the input clock signal (CLKIN) by the buffer circuit 225 (d1) and the output circuitry of the second digital device 110 (d3) (e.g., the buffer circuit 240) to generate the feedback clock signal (FbPDD). The modeled delays are referenced as d1' and d3' to correspond to the actual delays d1 and d3, respectively. The output of the buffer 235 is provided to the delay monitor 250. Because the output of the buffer circuit 235 is fed to the delay monitor 250, its delay (d2) need not be modeled by the delay monitor 250. The output of the phase detector 245 is provided to the forward delay array 215 for controlling the synchronization after the completion of the measurement initialization cycle.

The reference clock signal (RefPDD) generated by the buffer 225 is coupled provide a clock signal to a first series of data flip flops 255 that generate a feedback clock enable signal (FbClkEn), which is provided as a start signal to a counter 260. The RefPDD signal also clocks the counter 260.

The feedback clock signal (FbPDD) is coupled provide a clock signal to a second series of data flip flops 265 that generate a measurement delay clock signal (MsDyClk) as an output. The MsDyClk signal is provided to a delay element 270. The delay element 270 provides a fixed minimum delay to allow the timing control 115 to operate over a wide range of conditions. The amount of delay provided by the delay element 270 may vary depending on the particular implementation. The delay element 270 is coupled to a data flip flop 275 that is clocked by the RefPDD signal to generate a measurement pulse signal (MStrobe). The MStrobe signal is coupled to the counter 260 as a stop input. The MStrobe signal is also provided to the measure circuit 210 to trigger the synchronization of the input and output clock signals.

The operation of the timing control circuit 115 is now described in greater detail. Prior to synchronization, the multiplexer 230 is controlled to bypass the forward delay array 215. Hence, the feedback clock signal, FbPDD, is simply the reference clock signal, RefPDD, after it passes through the multiplexer 230, the buffer 235, and the delay monitor 250. When the input clock signal begins to transition, the RefPDD signal clocks the data flip flops 255. At a later point in time, the RefPDD signal propagates through the feedback path and the rising edges are seen in the FbPDD signal, which clocks the flip flops 265.

Following the third clock pulse, i.e., due to there being three flip flops 255, the FbClkEn signal is asserted, and the counter 260 begins counting each pulse of the RefPDD signal. The FbPDD signal clocks the flip flops 265, and after the third pulse, the MsDyClk signal is asserted, which clocks the measure delay array 205. The MsDyClk signal generated by the data flip flops 265 propagates through the measure delay array 205 until the measure circuit 210 is triggered. The measure circuit 210 includes a series of latches (not shown) that are triggered by the MStrobe signal. The particular latches triggered are those that correspond to the position of the pulse in the measure delay array 205.

Subsequently, the MsDyClk signal passes through the delay element 270 and is latched in the data flip flop 275 following the next rising edge of the RefPDD signal, thus generating the MStrobe signal. The MStrobe signal stops the counter 260 and latches the measure circuit 210, thereby configuring the forward delay array 215 to synchronize the CLKIN and CLKOUT signals. The start and stop signals provided to the counter 260 are synchronized with the rising edge of the RefPDD signal. The value of the counter 260, LoopCount, represents the number of clock signals required for the reference clock signal to propagate through the feedback path. The number of flip flops in the groups 255, 265 may vary depending on the particular implementation. In the illustrated embodiment, thee stages are provided to allow the feedback path to be populated with clock signals and stabilize prior to synchronizing the clock signals.

After the forward delay array 215 is configured, the multiplexer 230 is configured to select the forward delay array 215 as its input. The output of the forward delay array 215 then passes through the buffer 235 and the delay monitor 250 and becomes the source for the feedback clock signal, FbPDD, provided to the phase detector 245. The phase detector 245 subsequently controls the forward delay array 215 to maintain the synchronization of the CLKIN and CLKOUT signals. The FbPDD signal is synchronized with the RefPDD signal with a multiple clock cycle difference, N*tCK. The LoopCount output of the counter 260 represents the value of N. Generally, a higher frequency clock signal results in a larger value for N.

Figure 3:
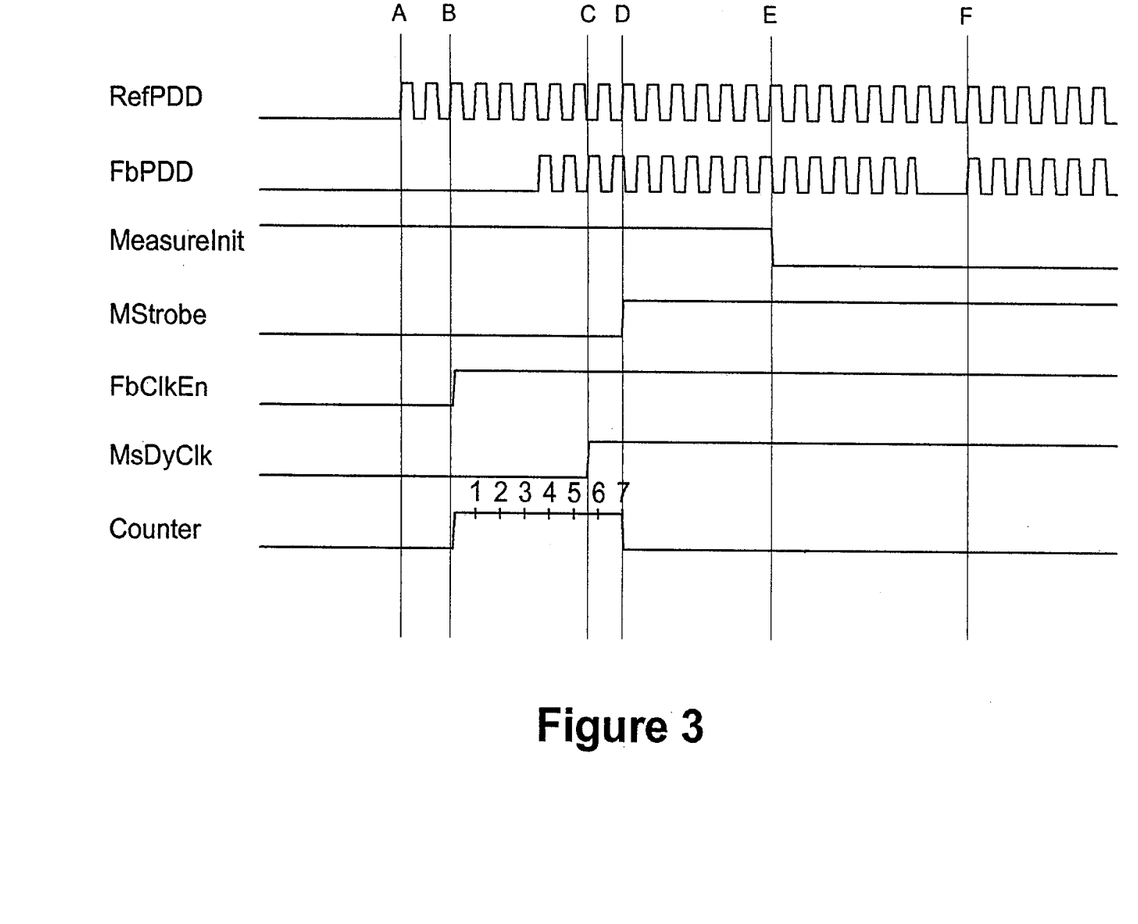
FIG. 3 is a timing diagram illustrating the operation of the timing control circuit of FIG. 2.

Turning now to FIG. 3, a timing diagram illustrating the operation of the timing control circuit 115 is provided. The reference clock, RefPDD, and corresponding feedback clock, FbPDD, are illustrated. A MeasureInit signal represents the mode of the measure circuit 210. The MCD circuit 220 is operated during the measure initialization mode, and the DDL is operated otherwise. The measurement strobe, MStrobe, feedback clock enable, FbClkEn, and measurement delay clock, MsDyClk signals are also illustrated. A counter signal is provided to illustrate the time period that the counter 260 is enabled. The Counter signal is not an actual signal employed in the timing control circuit 115, but rather is a composite of the FbClkEn and MStrobe signals that start and stop the counter 260.

At time point A, the reference clock signal begins transitioning. The timing control circuit 115 operates in measurement initialization mode, so the MeasureInit signal is asserted and the multiplexer 230 is configured to bypass the forward delay array 215. At time point B, the third cycle of the RefPDD signal is latched by the flip flops 255, thus asserting the FbClkEn signal and starting the counter 260. At time point C, the third cycle of the FbPDD signal is latched by the flip flops 265 indicating that the reference clock has propagated the feedback path and causing the assertion of the MsDyClk signal. The MsDyClk signal pulses the measure delay array 205.

At time point D, the MsDyClk signal, as delayed by the delay element 270 is latched in the flip flop 275 causing the assertion of the MStrobe signal. The MStrobe signal activates the measure circuit 210 to determine the position of the previous MsDyClk pulse in the measure delay array 205 and stop the counter 260. The delay in the forward delay array 215 is set by the position latched in the forward delay array 215 to synchronize the reference and feedback clock signals.

At time point E, the MeasureInit signal is deasserted and the multiplexer 230 is configured to use the signal passing through the forward delay array 215 for the output clock signal, CLKOUT. At time point F, the signal passing through the forward delay array 215 to the buffer 235 propagates through the feedback path to the delay monitor 250 to become the FbPDD signal. The RefPDD and FbPDD signals are provided to the phase detector 245 for subsequent synchronization control. Subsequent changes in the relative phases of the RefPDD and FbPDD signals will cause the phase detector 245 to adjust the delay provided by the forward delay array 215 to maintain synchronization.

The LoopCount value determined by the counter 260 represents the value of N, which identifies the number of clock cycles that the output clock is offset from the input clock. The LoopCount value has various uses. For example, the phase detector 245 employs the LoopCount value to ensure that any changes applied to the delay of the forward delay array 215 are propagated through the feedback path and are reflected in the FbPDD signal prior to making another phase comparison. In other words, the phase detector 245 is configured such that it does not update any more frequently than N clock cycles, as specified by the LoopCount. The LoopCount value is also useful for establishing read latency in a memory device. An exemplary device employing the LoopCount is described in U.S. Pat. No. 6,687,185, entitled "METHOD AND APPARATUS FOR SETTING AND COMPENSATING READ LATENCY IN A HIGH SPEED DRAM," assigned to the assignees of the present application, and incorporated herein by reference in its entirety.

Figure 4:
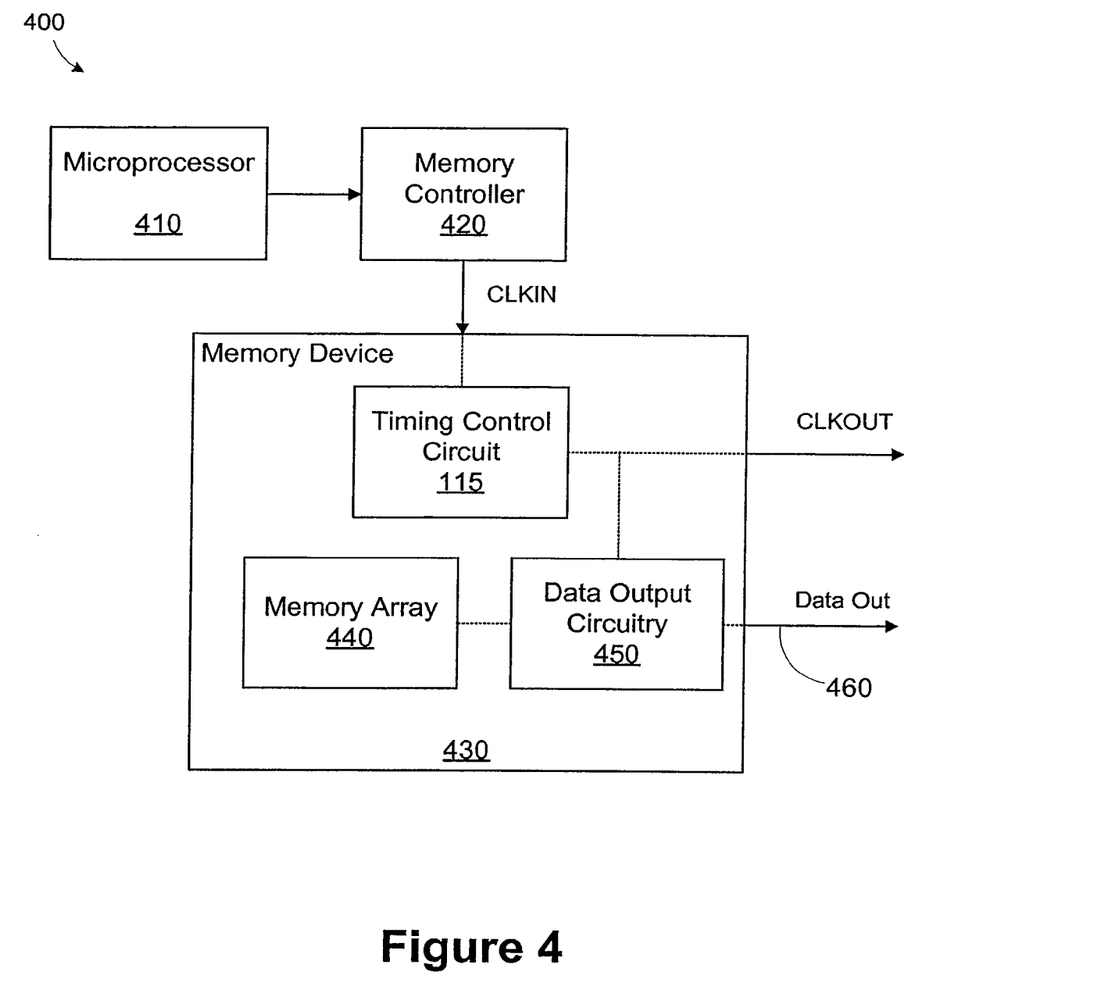
FIG. 4 is a simplified block diagram of a system in one embodiment of the present invention including the timing control circuit of FIG. 2.

Turning now to FIG. 4, a simplified block diagram of a computer system 400 incorporating the timing control circuit 115 is shown. The computer system 400 includes a microprocessor 410 coupled to a memory controller 420. The memory controller 420 is coupled to a memory device 430. The microprocessor 410 issues commands to the memory controller 420 to access data stored in the memory device 430. The memory device 430 includes a memory array 440 for storing data and data output circuitry 450 for outputting data read from the memory array 440 on a data output path 460. The memory controller 420 provides the input clock signal (CLKIN) to the memory device 430.

The timing control circuit 115 receives the input clock signal and generates the output clock signal (CLKOUT) for clocking the data output circuitry 450. For clarity and to avoid obscuring the instant invention, only those interconnections and modules related to the control of the timing in the memory device 430 are illustrated. The microprocessor 410, memory controller 420, and memory device 430 (i.e., with the exception of the timing control circuit 115) may take on numerous forms, depending on the particular implementation. Those of ordinary skill in the art are knowledgeable regarding the particular construct and operation of these devices.

The particular embodiments disclosed above are illustrative only, as the embodiments of the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

I claim:

1. An apparatus for synchronizing an output clock signal with an input clock signal, comprising:
   a first timing synchronization circuit operable to generate a delay to synchronize a reference clock signal representative of the input clock signal with a feedback clock signal representative of the output clock signal responsive to a strobe signal, wherein the first timing synchronization circuit is further operable to synchronize the input clock signal with the output clock signal during a measurement initialization interval;
   control logic operable to generate an enable signal based on the reference clock signal and generate the strobe signal based on the feedback clock signal;
   a counter operable to count cycles of the reference clock signal occurring between the enable signal and the strobe signal to generate a loop count for the first timing synchronization circuit; and
   a second timing synchronization circuit operable to synchronize the reference clock signal with the feedback clock signal after completion of the measurement initialization interval.

2. The apparatus of claim 1, wherein the first timing synchronization circuit comprises one of a measure control delay circuit, a synchronous mirror delay circuit, or a phase locked loop circuit.

3. The apparatus of claim 1, wherein the first timing synchronization circuit includes a variable delay device configured in response to the strobe signal, and the second timing synchronization circuit is operable to adjust delay provided by the variable delay device responsive to a phase difference between the reference clock signal and the feedback clock signal.

4. The apparatus of claim 3, further comprising a multiplexer operable to provide the reference clock signal as the output clock signal during the measurement initialization interval and a signal output by the variable delay device as the output signal after completion of the measurement initialization interval.

5. The apparatus of claim 3, wherein the second timing synchronization circuit comprises a phase detector operable to receive the reference clock signal and the feedback clock signal, wherein an update frequency of the phase director is based on the loop count.

6. An apparatus for synchronizing an output clock signal with an input clock signal, comprising:
   a first timing synchronization circuit operable to generate a delay to synchronize a reference clock signal representative of the input clock signal with a feedback clock signal representative of the output clock signal responsive to a strobe signal;
   control logic including:
     a first plurality of data flip flops operable to register a first predetermined number of cycles of the reference clock signal to generate an enable signal; and
     a second plurality of data flip flops operable to register a second predetermined number of cycles of the feedback clock signal to generate the strobe signal; and a counter operable to count cycles of the reference clock signal occurring between the enable signal and the strobe signal to generate a loop count for the first timing synchronization circuit.

7. The apparatus of claim 6, wherein the second plurality of data flip flops comprises:
a first subset of the second plurality of data flip flops operable to register the first predetermined number of cycles of the feedback clock signal to generate a measurement signal; and
a strobe data flip flop operable to receive the measurement signal and output the strobe signal.

8. The apparatus of claim 7, further comprising a delay element disposed between the first subset of the data flip flops and the strobe data flip flop.

9. The apparatus of claim 7, wherein the first timing synchronization circuit comprises a measurement device operable to receive the measurement signal and a latch device operable to register a position of the measurement signal in the measurement device responsive to receiving the strobe signal.

10. An apparatus for synchronizing an output clock signal with an input clock signal, comprising:
a first timing synchronization circuit operable to generate a delay to synchronize a reference clock signal representative of the input clock signal with a feedback clock signal representative of the output clock signal responsive to a strobe signal;
control logic operable to generate an enable signal based on the reference clock signal and generate the strobe signal based on the feedback clock signal; and
a counter including:
a start terminal operable to receive the enable signal;
a stop terminal operable to receive the strobe signal;
the counter operable to count cycles of the reference clock signal occurring between the enable signal and the strobe signal to generate a loop count for the first timing synchronization circuit.

11. An apparatus for synchronizing an output clock signal with an input clock signal, comprising:
a first timing synchronization circuit operable to generate a delay to synchronize a reference clock signal representative of the input clock signal with a feedback clock signal representative of the output clock signal responsive to a strobe signal;
control logic operable to generate an enable signal based on the reference clock signal and generate the strobe signal based on the feedback clock signal;
a counter operable to count cycles of the reference clock signal occurring between the enable signal and the strobe signal to generate a loop count for the first timing synchronization circuit; and
a delay monitor operable to receive the output clock signal and delay the output clock signal to approximate delays introduced by input and output circuitry of a device including the apparatus and generate the feedback clock signal.

12. A method for synchronizing an input clock signal and an output clock signal, comprising:
generating an enable signal for a timing synchronization circuit responsive to detecting a presence of a reference clock signal representative of the input clock signal;
generating a strobe signal responsive to detecting a presence of feedback clock signal representative of the output clock signal;
configuring an amount of delay provided by the timing synchronization circuit responsive to the strobe signal; and
counting cycles of the reference clock signal occurring between the enable signal and the strobe signal to determine a loop count parameter for the timing synchronization circuit; and
adjusting the delay provided by the timing synchronization circuit after configuring the amount of delay responsive to the strobe signal, wherein said adjusting the delay comprises measuring the phase difference in a phase detector, wherein an update frequency of the phase director is based on the loop count.

13. The method of claim 12, wherein the timing synchronization circuit comprises one of a measure control delay circuit, a synchronous mirror delay circuit, or a phase locked loop circuit.

14. A method for synchronizing an input clock signal and an output clock signal, comprising:
generating an enable signal for a timing synchronization circuit responsive to detecting a first predetermined number of cycles of a reference clock signal representative of the input clock signal;
generating a strobe signal responsive to detecting a second predetermined number of cycles of a feedback clock signal representative of the output clock signal;
configuring an amount of delay provided by the timing synchronization circuit responsive to the strobe signal; and
counting cycles of the reference clock signal occurring between the enable signal and the strobe signal to determine a loop count parameter for the timing synchronization circuit.

15. The method of claim 14, further comprising:
detecting the first predetermined number of cycles of the feedback clock signal to generate a measurement signal; and
generating the strobe signal responsive to receiving the measurement signal.

16. The method of claim 15, further comprising delaying the measurement signal by a predetermined amount prior to generating the strobe signal.

17. The method of claim 15, further comprising:
receiving the measurement signal in a measurement device of the timing synchronization circuit;
registering a position of the measurement signal in the measurement device responsive to receiving the strobe signal; and
configuring the amount of delay based on the position of the measurement signal.

18. A method for synchronizing an input clock signal and an output clock signal, comprising:
generating an enable signal for a timing synchronization circuit responsive to detecting a presence of a reference clock signal representative of the input clock signal;
generating a strobe signal responsive to detecting a presence of feedback clock signal representative of the output clock signal;
configuring an amount of delay provided by the timing synchronization circuit responsive to the strobe signal;
counting cycles of the reference clock signal occurring between the enable signal and the strobe signal to determine a loop count parameter for the timing synchronization circuit;
starting a counter responsive to receiving the enable signal; and stopping the counter responsive to receiving the strobe signal, the output of the counter representing the loop count.

19. A method for synchronizing an input clock signal and an output clock signal, the method comprising:
providing an indication of a first mode of operation;
bypassing a delay array responsive to the indication of the first mode of operation;
setting an initial delay of the delay array during the first mode of operation based, at least in part, on a reference clock signal representative of the input clock signal and a feedback clock signal representative of the output clock signal;
generating a loop count during the first mode of operation based, at least in part, on a time for the reference clock signal to propagate through a feedback path to generate the feedback signal;
providing an indication of a second mode of operation;
responsive to the indication of the second mode of operation, generating the feedback clock signal based, at least in part, on the reference clock signal delayed by the delay array; and
adjusting the delay of the delay array during the second mode of operation based on a phase difference between the feedback clock signal and the reference clock signal.

20. The method of claim 19, wherein a frequency with which the delay is adjusted is based, at least in part, on the loop count.

21. The method of claim 19, wherein the method occurs in a memory device and the method further comprises:
setting a latency of the memory device based, at least in part, on the loop count.

22. The method of claim 19, wherein said setting an initial delay comprises utilizing a measure-controlled delay circuit.

23. The method of claim 19, wherein said adjusting the delay of the delay array comprises using a delay locked loop.

24. The method of claim 19, wherein said bypassing a delay array comprises selecting the reference clock signal as an output of a multiplexor, wherein the feedback clock signal is generated based, at least in part, on the output of the multiplexor.

* * * * *

UNITED STATES PATENT AND TRADEMARK OFFICE
CERTIFICATE OF CORRECTION

PATENT NO. : 8,732,509 B2  
APPLICATION NO. : 12/755664  
DATED : May 20, 2014  
INVENTOR(S) : Jongtae Kwak

Page 1 of 1

It is certified that error appears in the above-identified patent and that said Letters Patent is hereby corrected as shown below:

Title Page, item (57), in column 2, under "Abstract", line 7, after "responsive" insert -- to --.

In the Claims
In column 6, line 52, in Claim 5, delete "director" and insert -- detector --, therefor.
In column 8, line 14, in Claim 12, delete "director" and insert -- detector --, therefor.

Signed and Sealed this
Nineteenth Day of August, 2014

Michelle K. Lee
*Deputy Director of the United States Patent and Trademark Office*